United States Patent
Bose et al.

(10) Patent No.: US 11,923,724 B2
(45) Date of Patent: Mar. 5, 2024

(54) SYSTEMS AND METHODS FOR SELF-LEARNING OF TRANSFORMER INRUSH CHARACTERISTICS TO OPTIMIZE TRANSFER TIMES IN STATIC TRANSFER SWITCH

(71) Applicant: ABB Schweiz AG, Baden (CH)

(72) Inventors: Veerakumar Bose, Henrico, VA (US); Christopher A. Belcastro, Mechanicsville, VA (US)

(73) Assignee: ABB Schweiz AG, Baden (CH)

( * ) Notice: Subject to any disclaimer, the term of this patent is extended or adjusted under 35 U.S.C. 154(b) by 6 days.

(21) Appl. No.: 17/869,949

(22) Filed: Jul. 21, 2022

(65) Prior Publication Data
US 2024/0030741 A1   Jan. 25, 2024

(51) Int. Cl.
*H02J 7/00* (2006.01)
*G01R 19/10* (2006.01)
*G01R 19/165* (2006.01)
*H02J 9/06* (2006.01)

(52) U.S. Cl.
CPC .............. *H02J 9/062* (2013.01); *G01R 19/10* (2013.01); *G01R 19/16571* (2013.01)

(58) Field of Classification Search
CPC .... H02J 3/0073; H02J 7/0047; H02J 7/00712; H02J 9/06; H02J 9/062; H02J 9/068
USPC ......................................................... 307/64
See application file for complete search history.

(56) References Cited

U.S. PATENT DOCUMENTS

2019/0245340 A1* 8/2019 Porter .................... G01R 31/42

FOREIGN PATENT DOCUMENTS

| EP | 2736147 A1 | 5/2014 |
|---|---|---|
| WO | WO 2006/015366 A2 | 2/2006 |
| WO | WO 2021/015962 A1 | 1/2021 |
| WO | WO 2021/195509 A2 | 9/2021 |

OTHER PUBLICATIONS

European Patent Office, Extended European Search Report in European Patent Application No. 23186977.7, 9 pp. (dated Dec. 21, 2023).

* cited by examiner

*Primary Examiner* — Daniel Kessie
*Assistant Examiner* — Xuan Ly
(74) *Attorney, Agent, or Firm* — Leydig, Voit & Mayer, Ltd.

(57) ABSTRACT

A system for using one of two independent alternating power sources to power a load is provided. The system sets a flux match to a first value, wherein the flux match indicates a set range for switching between powering the load using a first power source and powering the load using a second power source. The system switches between powering the load using the first power source and powering the load using the second power source using the first flux match value. The system further obtains a first set of inrush current values associated with the switching. Based on the first set of inrush current values and a maximum inrush current threshold, the system adjusts the flux match to a second value and switches between powering the load using the first power source and powering the load using the second power source using the second flux match value.

20 Claims, 6 Drawing Sheets

SYSTEMS AND METHODS FOR SELF-LEARNING OF TRANSFORMER INRUSH CHARACTERISTICS TO OPTIMIZE TRANSFER TIMES IN STATIC TRANSFER SWITCH

BACKGROUND

A static transfer switch (STS) is a solid state switching equipment that is configured to power a load using one of two independent alternating current (AC) power sources. Under certain conditions, the STS may transfer from using the first AC power source to using the second AC power source and vice versa. The STS may perform the transfer between the two independent AC sources in a way that does not saturate a transformer that is downstream from the two AC power sources, and that powers the load. To avoid saturation of the transformer, the STS may delay the switch from the first AC power source to the second AC power source in order to synchronize the flux created in the transformer by the second AC power source with flux created by the first AC power source.

However, waiting for the perfect synchronization of flux from two AC power sources to match the transformer is time consuming, and increases the time needed to transfer from the first AC power source to the second AC power source. Existing STS transfer algorithms execute transfers between the two AC sources when the absolute flux difference between first AC source and the second AC source are within 30% from one another, irrespective of the maximum saturation flux density level of the transformer. This is based on the assumption that the transformer will not saturate when flux in the transformer increased by 30% during transfers between the two independent AC power sources. While some transformers may not be able to handle the 30% flux increase, and may saturate, some other transformers may be capable of handling more than 30% flux increase without saturation. Accordingly, there remains a technical need to provide an STS equipment system that is able to dynamically alter the flux match range required to transfer from the first AC power source to the second AC power source without saturating the transformer and to optimize the time it takes to transfer from the first AC power source to the second AC power source.

SUMMARY

A first aspect of the present disclosure provides a system for executing a transfer from a first power source to a second power source to power a load. The system comprises: the first power source and the second power source, wherein the first power source and the second power source are both electrically coupled to a transformer; the transformer electrically coupled to the load, wherein the first power source and the second power source are configured to provide power to the load via the transformer; one or more switching devices configured to switch between using the first power source to power the load or using the second power source to power the load; one or more sensors configured to detect an electrical measurement associated with powering the load; and a controller configured to: set a flux match to a first flux match value, wherein the flux match indicates a set range for switching between powering the load using the first power source and powering the load using the second power source; switch between powering the load using the first power source and powering the load using the second power source using the first flux match value and the one or more switching devices; obtain, from the one or more sensors, a first set of inrush current values associated with switching between powering the load using the first power source and powering the load using the second power source; adjust the flux match to a second flux match value based on the first set of inrush current values and a maximum inrush current threshold; and switch between powering the load using the first power source and powering the load using the second power source using the second flux match value and the one or more switching devices.

According to an implementation of the first aspect, the controller is further configured to: obtain, from the one or more sensors, a second set of inrush current values associated with switching between powering the load using the first power source and powering the load using the second power source; adjust the flux match from the second flux match value to a third flux match value based on the second set of inrush current values and the maximum inrush current threshold.

According to an implementation of the first aspect, the controller is further configured to: determine an average transfer time for switching between powering the load using the first power source and powering the load using the second power source; compare the average transfer time with a maximum transfer time threshold; and display a warning signal in response to determining that the determined average transfer time is greater than the maximum transfer time threshold.

According to an implementation of the first aspect, the first flux match value indicates the first set range for switching between powering the load using the first power source and powering the load using the second power source based on a phase of the first power source and a phase of the second power source.

According to an implementation of the first aspect, the controller is further configured to: switch, using the one or more switching devices, between powering the load using the first power source and powering the load using the second power source based on determining that a difference between a flux of the first power source and a flux of the second power source is within the first set range.

According to an implementation of the first aspect, the controller is configured to adjust the flux match to the second flux match value by: determining whether an average of the first set of inrush current values is greater than the maximum inrush current threshold, wherein the first set of inrush current values comprises two or more inrush current values; and decreasing the flux match from the first flux match value to the second flux match value in response to determining that the average of the first set inrush current values is greater than the maximum inrush current threshold.

According to an implementation of the first aspect, the controller is configured to adjust the flux match to the second flux match value by: increasing the flux match from the first flux match value to the second flux match value in response to determining that the average of the first set of inrush current values is less than the maximum inrush current threshold.

According to an implementation of the first aspect, the controller is further configured to compute the average of the first set of inrush current values by: detecting a plurality of times the system switches between powering the load using the first power source and powering the load using the second power source; obtaining, from the one or more sensors, an inrush current for each of the plurality of times;

and calculating an average of the first set of inrush current values based on the obtained inrush current values for each of the plurality of times.

According to an implementation of the first aspect, the controller is configured to determine the maximum inrush current threshold by multiplying a rated load current associated with the transformer with a maximizing factor.

According to an implementation of the first aspect, the controller is further configured to: determine whether the transformer is saturated based on switching between powering the load using the first power source and powering the load using the second power source using the different first flux match value.

According to an implementation of the first aspect, the controller is configured to determine whether the transformer is saturated by: obtaining, from the one or more sensors, an inrush current and an applied voltage at the transformer when the system switches between powering the load using the first power source and powering the load using the second power source; calculating a flux value at the transformer based on the obtained inrush current and the obtained applied voltage; and determining whether the calculated flux value has exceeded a maximum flux rating of the transformer.

According to an implementation of the first aspect, both the first power source and the second power source comprise single phase or three phase power sources.

According to an implementation of the first aspect, the controller is further configured to: obtain user input from a user indicating a manually provided flux match value; and adjust the flux match to the manually provided flux match value.

A second aspect of the present disclosure provides a method for executing a transfer from a first power source to a second power source to power a load. The method comprises setting, by a controller, a flux match to a first flux match value, wherein the flux match indicates a set range for switching between powering a load using the first power source and powering the load using the second power source; switching, by the controller, between powering the load using the first power source and powering the load using the second power source using the first flux match value and one or more switching devices; obtaining, by the controller and from one or more sensors, a first set of inrush current values associated with switching between powering the load using the first power source and powering the load using the second power source; adjusting, by the controller, the flux match to a second flux match value based on the first set of inrush current values and a maximum inrush current threshold; and switching, by the controller, between powering the load using the first power source and powering the load using the second power source using the second flux match value and the one or more switching devices.

According to an implementation of the second aspect, the method further comprises: obtaining, by the controller from the one or more sensors, a second set of inrush current values associated with switching between powering the load using the first power source and powering the load using the second power source; adjusting, by the controller, the flux match from the second flux match value to a third flux match value based on the second set of inrush current values and the maximum inrush current threshold.

According to an implementation of the second aspect, the method further comprises: determining, by the controller, an average transfer time for switching between powering the load using the first power source and powering the load using the second power source; comparing, by the controller, the average transfer time with a maximum transfer time threshold; and displaying, by the controller, a warning signal in response to determining that the determined average transfer time is greater than the maximum transfer time threshold.

According to an implementation of the second aspect, the first flux match value indicates the first set range for switching between powering the load using the first power source and powering the load using the second power source based on a phase of the first power source and a phase of the second power source.

According to an implementation of the second aspect, the method further comprises: switching, using the one or more switching devices, between powering the load using the first power source and powering the load using the second power source based on determining that a difference between a flux of the first power source and a flux of the second power source is within the first set range.

According to an implementation of the second aspect, the method further comprises: determining, by the controller, whether an average of the first set of inrush current values is greater than the maximum inrush current threshold, wherein the first set of inrush current values comprises two or more inrush current values; and decreasing, by the controller, the flux match from the first flux match value to the second flux match value in response to determining that the average of the first set inrush current values is greater than the maximum inrush current threshold.

A third aspect of the present disclosure provides a non-transitory computer-readable medium having processor-executable instructions stored thereon. The processor-executable instructions, when executed by one or more processors, facilitate: setting a flux match to a first flux match value, wherein the flux match indicates a set range for switching between powering a load using the first power source and powering the load using the second power source; switching between powering the load using the first power source and powering the load using the second power source using the first flux match value; obtaining a first set of inrush current values associated with switching between powering the load using the first power source and powering the load using the second power source; adjusting the flux match to a second flux match value based on the first set of inrush current values and a maximum inrush current threshold; and switching between powering the load using the first power source and powering the load using the second power source using the second flux match value.

All examples and features mentioned above may be combined in any technically possible way.

BRIEF DESCRIPTION OF THE DRAWINGS

Embodiments of the present disclosure will be described in even greater detail below based on the exemplary figures. The present disclosure is not limited to the exemplary embodiments. All features described and/or illustrated herein can be used alone or combined in different combinations in embodiments of the present disclosure. The features and advantages of various embodiments of the present disclosure will become apparent by reading the following detailed description with reference to the attached drawings which illustrate the following.

DETAILED DESCRIPTION

Examples of the presented application will now be described more fully hereinafter with reference to the accompanying FIGS., in which some, but not all, examples of the application are shown. Indeed, the application may be exemplified in different forms and should not be construed as limited to the examples set forth herein; rather, these examples are provided so that the application will satisfy applicable legal requirements. Where possible, any terms expressed in the singular form herein are meant to also include the plural form and vice versa, unless explicitly stated otherwise. Also, as used herein, the term "a" and/or "an" shall mean "one or more" even though the phrase "one or more" is also used herein. Furthermore, when it is said herein that something is "based on" something else, it may be based on one or more other things as well. In other words, unless expressly indicated otherwise, as used herein "based on" means "based at least in part on" or "based at least partially on".

Figure 1:
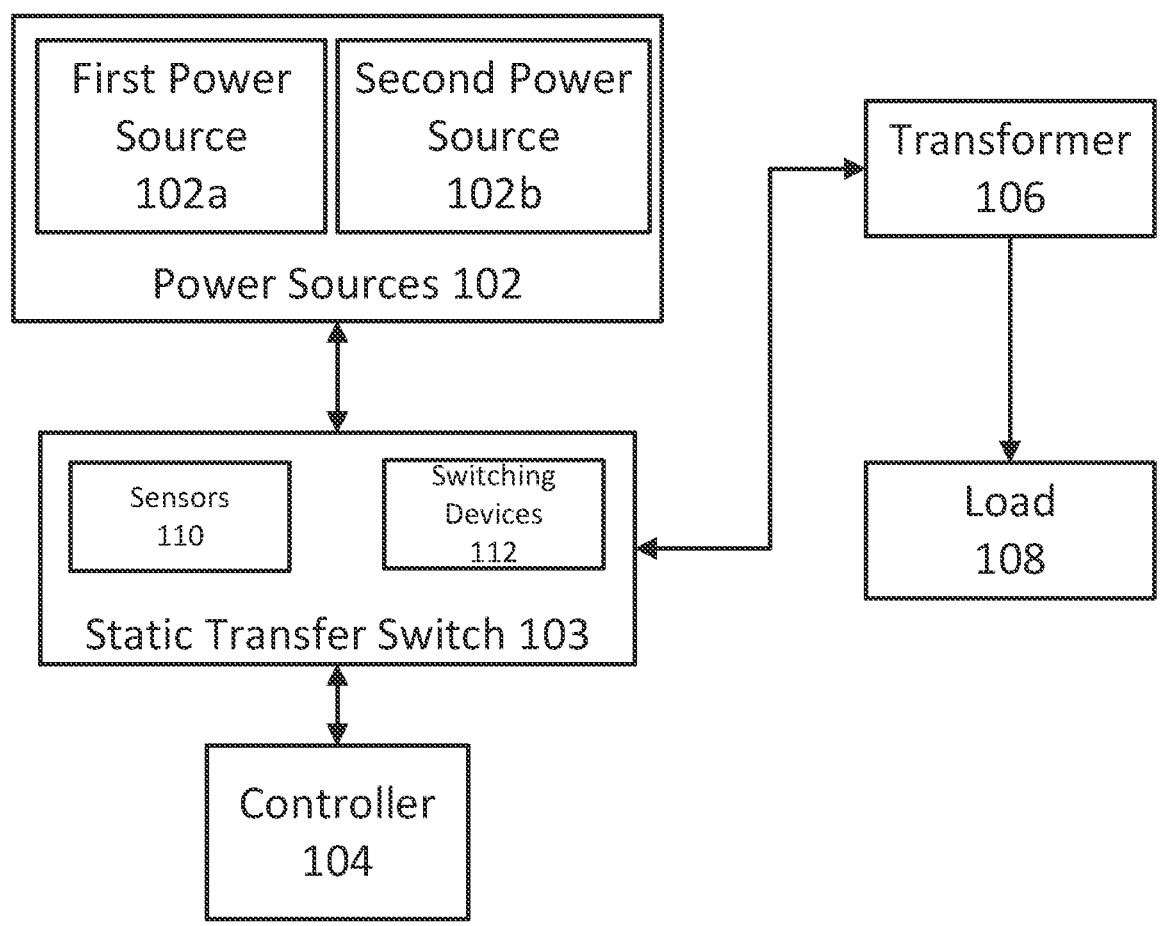
FIG. 1 is a simplified block diagram depicting an exemplary STS automatic switching environment using variable flux match in accordance with one or more examples of the present application.

Systems, methods, and computer program products are herein disclosed that provide for self-learning static transfer switches (STS) that are capable of altering the flux match values, which are used to execute transfer between powering a load using a first power source and a second power source. FIG. 1 is a simplified block diagram depicting an exemplary STS automatic switching environment 100 that uses variable flux match in accordance with one or more examples of the present application. FIG. 1 includes power sources 102, a static transfer switch 103, a controller 104, a transformer 106, and a load 108. Power sources 102 may include a first power source 102a and a second power source 102b. The power sources 102 may provide power to power one or more loads such as load 108. For example, the first power source 102a may provide power to the load 108. After a certain amount of time, the first power source 102a may be disconnected from the load 108, and instead, the second power source 102b may be connected to the load 108. In some examples, the first power source 102a may be a primary source and the second power source 102b may be a backup or a secondary power source. In some variations, the first power source 102a and the second power source 102b may be alternating current (AC) power sources that provide alternating current/power to the load 108. In some variations, the first power source 102a and the second power source 102b may be single phase or three phase power sources.

The load 108 may be any type of load that uses power from the power sources 102 to perform one or more tasks. The load 108 may accept AC power and/or direct current (DC) power from the transformer 106. The transformer 106 may be a device that transfers electrical energy from one circuit to another circuit (e.g., from the power sources 102 to the load 108). In some instances, the transformer 106 may convert and/or otherwise alter the current, voltage, and/or power from the power sources 102 prior to providing the current, voltage, and/or power to the load 108. For instance, the transformer 106 may step up and/or step down the current from the power sources 102 prior to providing the current to the load 108. Additionally, and/or alternatively, the transformer may convert the current from the power sources 102 (e.g., AC current) to another type of current (e.g., DC current).

The controller 104 is in electrical communication with one or more components of the STS 103. Additionally, and/or alternatively, while not shown, the controller 104 may also be in communication with other components within the environment 100 including the power sources 102, the transformer 106, and/or the load 108. For instance, the controller 104 may be in communication with the transformer 106 and/or one or more sensors associated with the transformer 106 to determine the status of the transformer 106. The controller 104 may be any type of hardware and/or software logic, such as a central processing unit (CPU), RASPBERRY PI processor/logic, processor, and/or logic, that executes computer executable instructions for performing the functions, processes, and/or methods described herein.

The STS 103 may include sensors 110, switching devices 112, and/or additional components, which may be described in FIG. 2 below. The controller 104 may use one or more components of the STS 103 to determine a variable flux match value, and use the variable flux match value to switch between powering the load 108 using the first and powering the load 108 using the second power sources 102a and 102b.

The sensors 110 may include current sensors, voltage sensors, and/or other sensors that provide measurements (e.g., current measurements) to the controller 104. The switching devices 112 may be any type of switching devices such as silicon-controlled rectifiers (SCRs) and/or other types of semiconductor switching devices that are configured to switch between powering the load 108 using the first power source 102a and the second power source 102b. For instance, the controller 104 may use switching devices 112 to switch between powering the load 108 using the first power source 102a to powering the load 108 using the second power source 102b, and vice versa.

In some examples, the controller 104 may switch how the load 108 is being powered based on one or more factors. For instance, initially, the load 108 may be powered by the first power source 102a. Based on the one or more factors, the controller 104 may switch from powering the load 108 using the first power source 102a to powering the load 108 using the second power source 102b. After a certain amount of time has elapsed, the controller 104 may switch back and power the load 108 using the first power source 102a. These factors may include, but are not limited to, the first AC power source 102a providing over or under expected voltage and/or over or under expected frequency to the load 108, inability by the first AC power source 102a to provide the necessary power required by load 108, and failure of the first AC power source 102a. In some examples, the controller 104 may be configured to routinely transfer between using the first power source 102a and the second power source 102b for powering the load 108. In such examples, switching devices 112 may switch between the first power source 102*a* and second power source 102*b* occasionally and/or periodically at regular intervals of time.

When executing a transfer from the first power source 102*a* to the second power source 102*b*, the controller 104 attempts to ensure that the transfer does not saturate the transformer 106. When the transformer 106 is saturated, the transformer 106 draws a very high amount of current from whichever power source 102 is connected to the transformer 106. This high current may cause a circuit breaker to trip to prevent damage to one or more components of the environment 100. Once the circuit breaker is tripped, power may cease to flow into the load 108, which may cause a disruption.

The transformer 106 may become saturated when there is a large amount of flux build up in the transformer 106. The flux build up may be caused when the controller 104 switches from powering the load 108 using the first power source 102*a* to powering the load 108 using the second power source 102*b*. For instance, the power sources 102*a* and 102*b* may be mismatched (e.g., the phases of the first power source 102*a* may be out of phase with the phases of the second power source 102*b*). As such, based on the phases between the first and second power sources 102*a* and 102*b* being too out of phase (e.g., out of phase by over 30 degrees), the transformer 106 may become saturated. For instance, if the mismatch in the phase angles of the voltage between the two AC power sources 102 are too de-synched, then abruptly transferring from the first power source 102*a* to the second power source 102*b* creates a flux build up in transformer 106. Once the flux build up crosses a certain threshold, the transformer 106 saturates, drawing large amounts of current from the power source 102 and potentially causing a circuit breaker to trip.

The flux value generated in a transformer is calculated based on the voltage applied to the transformer. For example, the flux value at a transformer is obtained by performing an integral on the voltage applied to the transformer.

In order to avoid saturation of the transformer 106, the controller 104 is configured to switch between power sources 102 for powering the load 108 based on a certain phase angle to control the flux in the transformer 106. For instance, the controller 104 may delay connecting the second power source 102*b* to transformer 106 in order to properly synchronize the flux created by the second power source 102*b* with flux created by the first power source 102*a*. However, waiting for the perfect synchronization of the flux created by the two power sources 102 in the transformer 106 is time consuming, and increases the time needed to transfer from the first power source 102*a* to the second power source 102*b*.

As such, the controller 104 is configured to optimize the time for switching between powering the load 108 using the two power sources 102*a*, 102*b* such that the delay time is minimized while still ensuring the transformer 106 does not become saturated. For instance, in some examples, the controller 104 may set a flux match value to a predetermined value (e.g., a first value) such as 20%. The controller 104 may provide instructions to the switching devices 112 to switch from the first power source 102*a* to the second power source 102*b* when the flux created by the first power source 102*a* and the flux created by the second power source 102*b* are within the predetermined value (e.g., 20%) of each other. For instance, based on determining the fluxes of the first and second power sources 102*a*, 102*b* are within the predetermined value, the controller 104 may provide instructions to the switching devices 112 to switch from the first power source 102*a* to the second power source 102*b*. Based on the instructions, the switching devices 112 may be configured to disconnect the load 108 from being powered by one of the power sources 102 (e.g., the first power source 102*a*) and connect the load 108 to being powered by the other power source (e.g., the second power source 102*b*). Furthermore, as will be explained below, the controller 104 may be configured to vary the flux match value (e.g., change the flux match value from 20% to 30% or from 20% to 10%). By varying the flux match value, the time delay for switching between the power sources 102 may be increased or decreased. For instance, as the flux match value increases, the time delay may decrease as there are more opportunities for the switching devices 112 to switch between the power sources 102. But, this may lead transformer saturation and this may also be dependent upon the transformer 106 itself (e.g., different transformers 106 may have different operating characteristics prior to saturation). As such, based on varying the flux match value, the controller 104 may be able to prevent the transformer 106 from saturating while also reducing the time taken to transfer between the power sources 102*a* and 102*b*.

The controller 104 may include one or more timers that are used to measure the time taken to transfer between the power sources 102. In some instances, the STS 103 may include one or more timers and these timers may provide times for switching to the controller 104. The sensors 110 may include one or more sensors that are configured to measure the current output from the first power source 102*a*, one or more sensors that are configured to measure the current output from the second power source 102*b*, and/or one or more sensors configured to measure the current provided to the transformer 106. The current measured at the transformer 106 may be either from the first power source 102*a* or the second power source 102*b* depending on which is connected to the transformer 106. The values obtained by these current sensors 110 are provided to controller 104. The current measurements from the sensors 110 may be the inrush current measurements. In other words, the inrush current measurements may be the current measurements that are being provided by the first or second power source 102*a*, 102*b* to the load 108 via the transformer 106, and these current measurements may be obtained by the sensors 110. In some instances, the sensors 110 may obtain voltage measurements and/or power measurements, and the controller 104 may obtain the current measurements based on the voltage/power measurements.

The controller 104 may obtain the inrush current measurements (e.g., values) based on the switching devices 112 switching between powering the load 108 using the power sources 102. The controller 104 may also obtain the time it takes to switch between the power sources 102. The obtained values/times are compared with standard values/times to determine whether the transformer 106 is operating within ideal parameters.

A maximum inrush current rating may be used to determine the flux matching values. The maximum inrush current rating may be a maximum inrush current value that is based on the operating parameters of the transformer 106. For instance, each transformer 106 may include a maximum rated system current that it may be able to accept (e.g., 1,000 Amps). The maximum inrush current rating may be a value that is greater than the maximum rated system current such as 120% greater than the maximum rated system current (e.g., if the maximum rated system current is 1,000 Amps, then the maximum inrush current rating may be 1,200 Amps).

The controller 104 may determine the maximum inrush current based on the operating parameters of the transformer 106. For instance, the maximum inrush current that the transformer 106 may tolerate may be calculated as being 120% over the maximum rated system current. The maximum inrush current may be a static value that may be based on the specific transformer 106 (e.g., each transformer may be associated with a different maximum inrush current value). Each time the switching devices 112 switch between the first power source 102*a* powering the load 108 to the second power source 102*b* powering the load 108, the controller 104 may obtain an inrush current measurement from the sensors 110. The controller 104 may compare the inrush current measurements with the maximum inrush current value. Based on the comparison, the controller 104 may determine whether to maintain, increase, and/or decrease the flux match value. For instance, based on the controller 104 determining that the inrush current values are less than the maximum inrush current value, the controller 104 determines that transformer 106 may be capable of handling a larger variation in flux created at the transformer 106, and may increase the flux match value. Based on the controller 104 determining that the inrush current values are greater than the maximum inrush current values, the controller 104 may decrease the flux match value. Then, in the next iteration, the STS 103 and/or the controller 104 may use the new flux match value for switching between the power sources 102.

In some examples, the controller 104 may compare each inrush current value with the maximum inrush current value to determine whether to increase and/or decrease the flux match value. In other examples, the controller 104 may wait for a set number of switches between the two power sources 102 (e.g., 5, 10, 15 and so on) prior to determining whether to change the flux match value. For instance, the controller 104 may calculate an average of the accumulated number of inrush current values (e.g., an average of the last five inrush current values associated with switches between the first and second power sources 102) and compare the computed average to the maximum inrush current value. If controller 104 determines that the average is less than the maximum inrush current, the controller 104 determines that the transformer 106 may be able to handle an even larger variation in flux, and the controller 104 may increase the flux match value. Based on the controller 104 determining that the inrush current value or the average of certain number of inrush current values measured by the sensors 110 exceeds the inrush current value, the controller 104 may reduce the flux match value to a lower value to avoid saturation of the transformer 106 and/or to prevent damage to the circuit components within the environment 100. The controller 104 may continuously repeat this process of increasing or decreasing the flux match values. In this way, the controller 104 may optimize switching times between the first power source 102*a* and the second power source 102*b* and still avoid saturation of the transformer 106.

In some examples, the controller 104 uses one or more timers determine an amount of time it takes to switch between powering the load 108 using the first power source 102*a* and powering the load 108 using the second power source 102*b*, and vice versa. The controller 104 may obtain multiple measurements of the amount of time to switch between the power sources 102. Then, the controller 104 may determine an average amount of time to switch between powering the load 108 using the power sources 102. The controller 104 may compare the average amount of time with a maximum transfer time threshold. In some examples, the maximum transfer time threshold may be determined from the Information Technology Industry Council (ITIC) Computer & Business Equipment Manufacturer's Association (CBEMA) curve that depicts the optimal values for transformer operation. In some examples, based on the average time being greater than the maximum transfer time threshold, the controller 104 may display a warning signal to notify operators that the transformer is in danger of saturation and/or damage, and/or perform other operations.

In some instances, the controller 104 may be configured to adjust the flux match based on user input. For instance, a user may input a flux match value (e.g., a manually provided flux match value) using an input device such as a human machine interface (HMI). The controller may be configured to obtain the user input indicating the manually provided flux match value and adjust the flux match to the manually provided flux match value.

It will be appreciated that the exemplary STS automatic switching environment depicted in FIG. 1 is merely an example, and that the principles discussed herein may also be applicable to other situations including STS environments with other components. For instance, while only two power sources 102*a*, 102*b* are shown in FIG. 1, in some instances, the STS automatic switching environment may include more than two power sources (e.g., three, four, and/or more power sources). The STS 103 and the controller 104 may be used to switch between the multiple different power sources.

Figure 2:
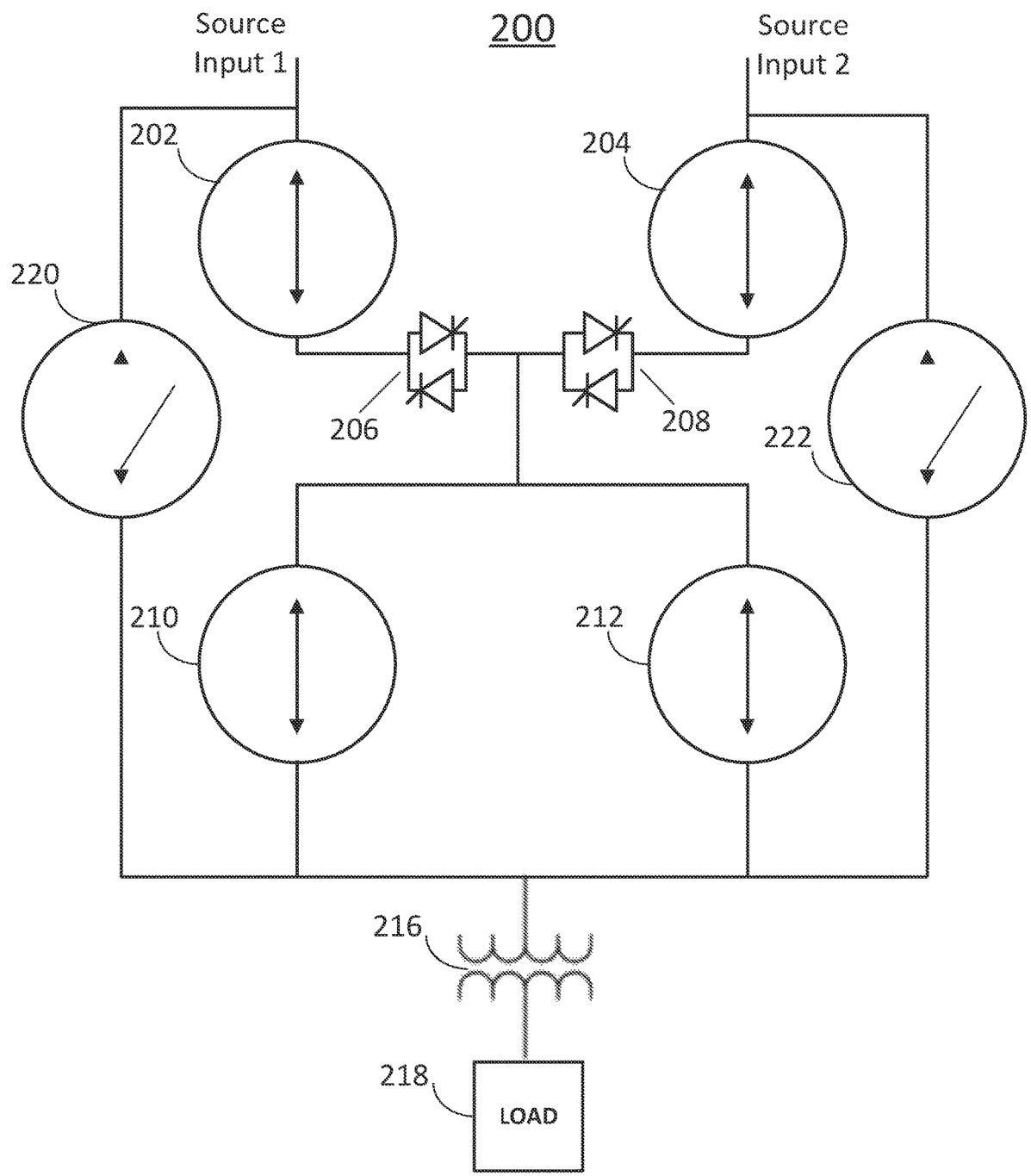
FIG. 2 is a simplified block diagram depicting the exemplary STS automatic switching system in accordance with one or more examples of the present application.

FIG. 2 is a simplified block diagram depicting the exemplary STS 200 in accordance with one or more examples of the present application. Elements 202 and 204 are input molded case switches, elements 210 and 212 are output molded case switches and elements 220 and 222 are manual bypass molded case switches. Input molded case switch 202, output mold case switch 210, and manual bypass molded case switch 220 are connected to source input 1, and input molded case switch 204, output mold case switch 212, and manual bypass molded case switch 222 are connected to source input 2. Silicon controlled rectifiers (SCRs) 206 and 208 are similar to switching devices 112 described in FIG. 1. SCRs 206 and 208 are used to switch between the two power sources 102. SCR 206 connects source input 1 to load 218 via transformer 216 and SCR 208 connects source input 2 to load 218 via transformer 216. In some embodiments, transformer 216 is similar to transformer 106 as described in FIG. 1. In some embodiments, load 218 is similar to load 108 described in FIG. 1. In some embodiments, one or more sensors are included in STS 202 and configured to measure current and voltage values at transformer 224 and/or additional/alternative values at other locations within the STS 202.

It will be appreciated that the exemplary STS automatic switching equipment depicted in FIG. 2 is merely an example, and that the principles discussed herein may also be applicable to other situations.

Figure 3:
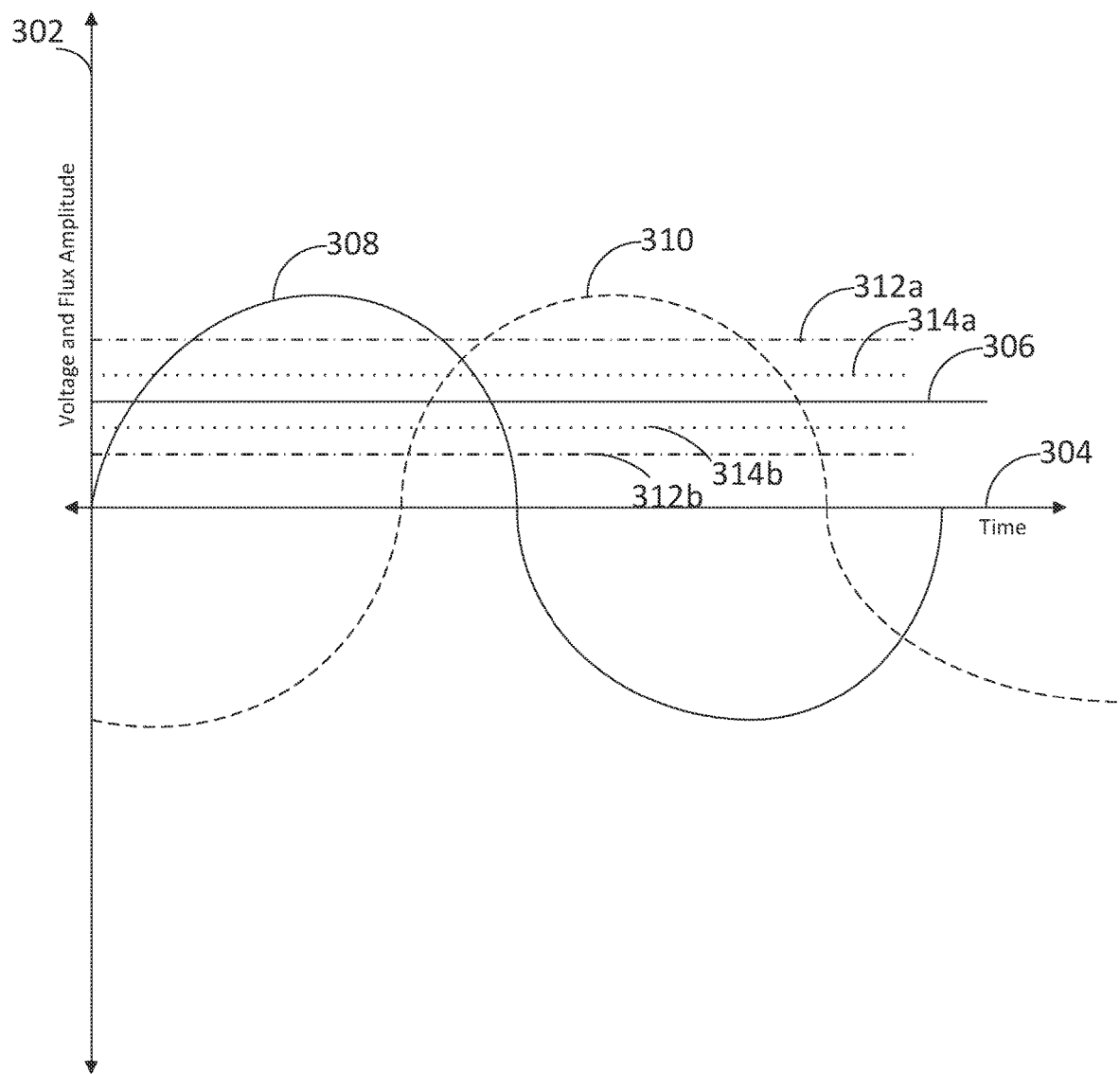
FIG. 3 is a simplified graph depicting the operation of the exemplary STS automatic switching environment in accordance with one or more examples of the present application.

FIG. 3 is a simplified graph depicting the operation of the exemplary STS automatic switching environment in accordance with one or more examples of the present application. Graph 300 shows the voltage and flux amplitude (measured in per unit) of the power sources 102 on the y-axis 302 versus time (measured in milliseconds) on the x-axis 304. For instance, graph 300 plots the per unit voltage amplitude of the second power source 102*b* and the prospective flux of the second power source 102*b* and residual flux of transformer 106 created by first power source 102*a*. In particular, the curve 308 depicts the per unit voltage amplitude of the second power source 102*b* and the curve 310 depicts the per unit prospective flux of the second power source 102b The curve 306 depicts the residual flux of the transformer which is created by first power source 102a.

At a time when controller 104 deems appropriate, the controller 104 switches from powering the load 108 using the first power source 102a to powering the load 108 using the second power source 102b and/or vice versa. As mentioned above, the controller 104 attempts to find optimal amplitude and prospective flux of the second power source 102b to switch the connected load 108 from the first power source 102a to the second power source 102b to avoid saturation of the transformer 106 and/or damage to components of the environment 100. The controller 104 may use flux match values to determine whether to switch between using the power sources 102 to power the load 108. For instance, line 306 denotes a 0% flux match value. Lines 314a and 314b denote a 10% flux match value. For instance, the controller 104 may set the flux match to 10%, and the controller 104 may instruct the switching devices 112 to switch power sources 102 based on the difference in flux between the two power sources 102 being within the lines 314a and 314b. Lines 312a and 312b denote a 20% flux match value. Similarly, the controller 104 may set the flux match to 20%, and the controller 104 may instruct the switching devices 112 to switch power sources 102 based on the difference in flux between the two power sources 102 being within the lines 312a and 312b.

Figure 4:
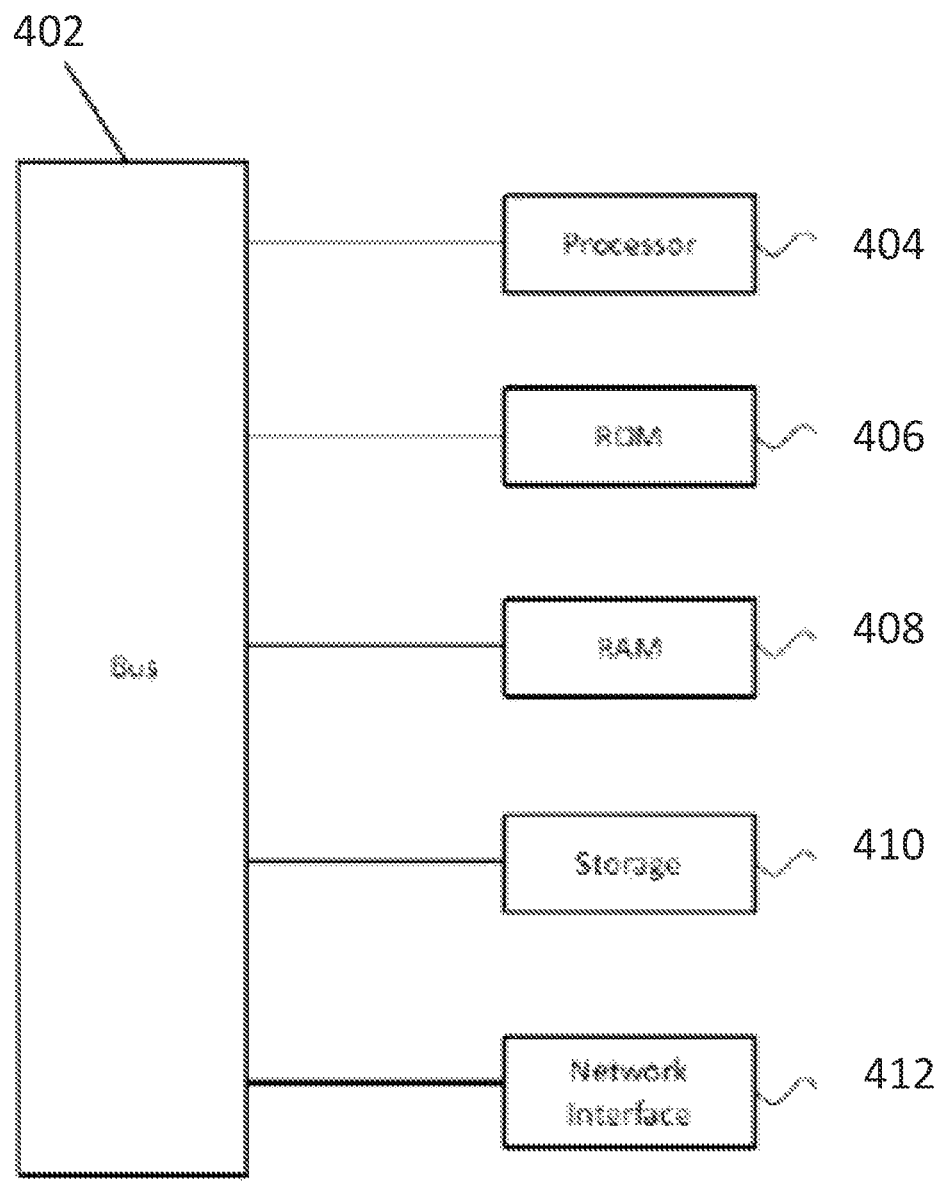
FIG. 4 is a simplified block diagram of one or more devices or systems within the exemplary environment of FIG. 1.

FIG. 4 is a block diagram of an exemplary system or device 400 within the environment 100 such as the controller 104. The system 400 includes a processor 404, such as a central processing unit (CPU), and/or logic, that executes computer executable instructions for performing the functions, processes, and/or methods described herein. In some examples, the computer executable instructions are locally stored and accessed from a non-transitory computer readable medium, such as storage 410, which may be a hard drive or flash drive. Read Only Memory (ROM) 406 includes computer executable instructions for initializing the processor 404, while the random-access memory (RAM) 408 is the main memory for loading and processing instructions executed by the processor 404. The network interface 412 may connect to a wired network or cellular network and to a local area network or wide area network. The system 400 may also include a bus 402 that connects the processor 404, ROM 406, RAM 408, storage 410, and/or the network interface 412. The components within the system 400 may use the bus 402 to communicate with each other. The components within the system 400 are merely exemplary and might not be inclusive of every component within the controller 104. Additionally, and/or alternatively, the system 400 may further include components that might not be included within every entity of environment 100. For instance, in some examples, the controller 104 might not include a network interface 412.

Figure 5:
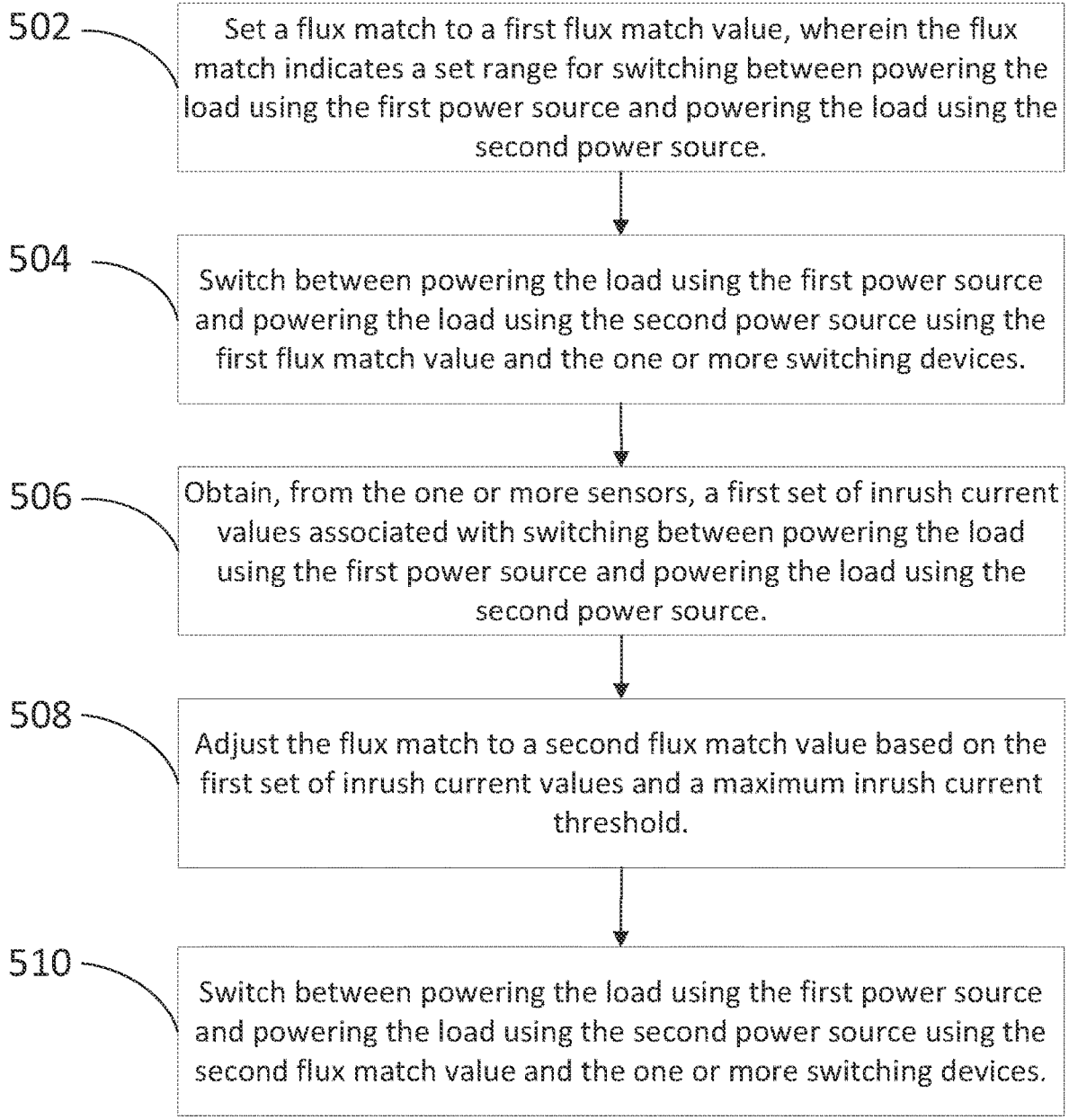
FIG. 5 is an exemplary process for using variable flux matching values for switching between power sources according to one or more examples of the present application

FIG. 5 is an exemplary process for using variable flux matching values for switching between power sources according to one or more examples of the present application. The process 500 may be performed by the environment 100 of FIG. 1 such as the controller 104. However, it will be recognized that any of the following blocks may be performed in any suitable order and that the process 500 may be performed in any environment and by any suitable computing device and/or controller. For instance, the process 500 may also be performed by the controller 104 shown in FIG. 1.

At block 502, the controller (e.g., controller 104) sets a flux match to a first flux match value, wherein the flux match indicates a set range for switching between powering the load using the first power source (e.g., first power source 102a) and powering the load using the second power source (e.g., first power source 102b). For instance, as mentioned above, the controller 104 is configured to determine a first flux match value (e.g., 20%) for switching between powering the load 108 using the power sources 102.

At block 504, the controller 104 may switch between powering the load 108 using the first power source 102a and powering the load 108 using the second power source 102b using the first flux match value and the one or more switching devices 112. For instance, the controller 104 may determine the flux values associated with the first power source 102a and the second power source 102b. In some embodiments, the flux values associated with the first power source 102a and the second power source 102b are determined (e.g., calculated or derived) based on the voltage readings of the first power source 102a and the second power source 102b. In such embodiments, the flux values are calculated by using an integral on the voltage values of the first power source 102a and the second power source 102b. Based on the flux values, the controller 104 may determine a difference (e.g., percentage) between the flux values. For instance, the controller 104 may compare the flux values for the two power sources 102a, 102b to determine a flux match difference. The controller 104 may compare the flux match difference with the first flux match value that was set at block 502. Based on the flux match difference being within the first flux match value, the controller 104 may provide instructions to the STS 103 to switch between the power sources 102 (e.g., from the first power source 102a to the second power source 102b or from the second power source 102b to the first power source 102a). Based on the flux match difference being outside the first flux match value, the controller 104 may continue to re-assess the flux match differences between the two power sources 102a, 102b.

At block 506, the controller obtains, from the one or more sensors (e.g., sensors 110), a first set of inrush current values associated with switching between powering the load using the first power source and powering the load using the second power source. For instance, the sensors 110 may obtain the measurements (e.g., inrush current measurements or values) and provide the measurements to the controller 104. In some embodiments, current measurements are instantaneous. In such embodiments, sensors 110 continuously measure current at the first power source 102a, the second power source 102b, and the transformer 106. In such embodiments, controller 104 analyzes the measured current of the transfer and calculates the reported maximum current which is considered as inrush current reported during transfer.

At block 508, the controller adjusts the flux match to a second flux match value based on the first set of inrush current values and a maximum inrush current threshold. For instance, the controller 104 may obtain one or more inrush current values from the sensors 110. For example, each time the STS 103 switches between the power sources 102, the controller 104 may obtain a new inrush current value from the sensors 110. Subsequently, the controller 104 may compare the inrush current values with a maximum inrush current threshold. For instance, as mentioned above, the controller 104 may determine the maximum inrush current threshold based on a maximum rated system current that it may be able to accept (e.g., 1,000 Amps). For instance, the controller 104 may determine the maximum inrush current threshold as 120% of the maximum rate system current (e.g., 1,200 Amps). Afterwards, the controller 104 may compare the inrush current values with the maximum inrush current threshold. For instance, the controller 104 may determine an average inrush current value and compare the average inrush current value with the maximum inrush current threshold. Based on the comparison, the controller 104 may adjust the flux match to a second flux match value. For instance, based on the average inrush current value being less than the maximum inrush current threshold, the controller 104 may increase the flux match (e.g., if the first flux match value is 20%, the controller 104 may increase the flux match to 30%). Based on the average inrush current value being greater than the maximum inrush current threshold, the controller 104 may decrease the flux match (e.g., if the first flux match value is 20%, the controller 104 may decrease the flux match to 10%).

At block 510, the controller switches between powering the load using the first power source and powering the load using the second power source using the second flux match value and the one or more switching devices. For instance, similar to block 504, the controller 104 may determine the flux difference between the power sources 102 and compare the flux difference to the second flux match value. Based on the comparison, the controller 104 may provide instructions to the STS 103 to switch the power source (e.g., power source 102a or 102b) that is powering the load 108.

The process 500 may continuously repeat. In other words, the controller 104 may continuously adjust the flux match values based on inrush current values from the sensors 110, and use the new flux match values to provide instructions to the STS 103 to switch between the power sources 102 that power the load 108.

In some instances, the controller is configured to determine whether the transformer is saturated based on switching between powering the load using the first power source and powering the load using the second power source using the different first flux match value. The controller 104 may receive the sensor measurements from one or more sensors (e.g., sensors 110 and/or sensors associated with the transformer 106). Based on the sensor measurements, the controller 104 may determine that the transformer is saturated. The controller 104 may might not execute any transfers to another power source based on determining the transformer is saturated. In some instances, the controller 104 obtains, from the one or more sensors, an inrush current and an applied voltage at the transformer when the system switches between powering the load using the first power source and powering the load using the second power source. The controller 104 may calculate a flux value at the transformer 106 based on the obtained inrush current and the applied voltage, and determine whether the calculated flux value has exceeded a maximum flux rating of the transformer.

Figure 6:
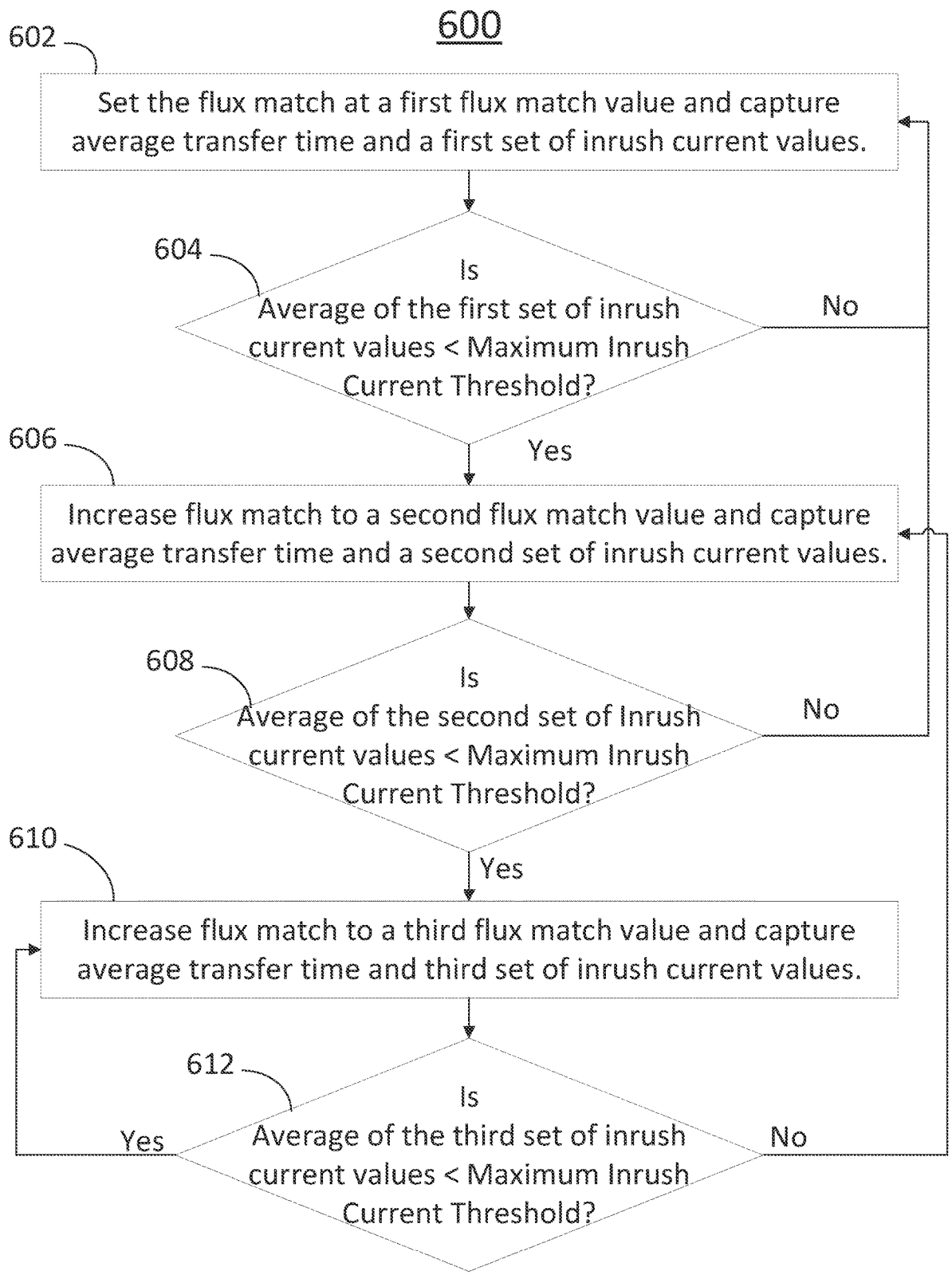
FIG. 6 is another exemplary process for using variable flux matching values for switching between power sources according to one or more examples of the present application.

FIG. 6 is another exemplary process for using variable flux matching values for switching between power sources according to one or more examples of the present application. The process 600 may be performed by the environment 100 of FIG. 1 such as the controller 104. However, it will be recognized that any of the following blocks may be performed in any suitable order and that the process 600 may be performed in any environment and by any suitable computing device or controller.

For example, the process 600 may be the continuous iteration of process 500. For instance, as mentioned above, the process 500 may repeat continuously and the flux values may continuously be adjusted based on the inrush current values from the sensors 110. Process 600 describes the continuous iteration of process 500.

At block 602, the controller 104 sets the flux match at a first flux match value and captures an average transfer time and a first set of inrush current values. At decision block 604, the controller 104 determines whether the average of the first set of inrush current values is less than the maximum inrush current threshold. In response to determining that the average of the first set of inrush current values is less than the maximum inrush current threshold, process 600 proceeds to block 606 where controller 104 increases the flux match to a second flux match value and captures average transfer time and a second set of inrush current values. In response to determining that the average of the first set of inrush current values is greater than or equal to the maximum inrush current threshold, the process 600 proceeds to block 602, where controller 104 sets the flux match at the first flux match value and capture average transfer time and a new set of inrush current values. At decision block 608, the controller 104 determines whether the average of the second set of inrush current values is less than the maximum inrush current threshold. In response to determining that the average of the second set of inrush current values is less than the maximum inrush current threshold, process 600 proceeds to block 610 where controller 104 increases the flux match to a third flux match value and captures average transfer time and a third set of inrush current values. In response to determining that the average of the second set of inrush current values is greater than or equal to the maximum inrush current threshold, the process 600 proceeds to block 606, where controller 104 sets the flux match at the second flux match value and captures average transfer time and a new set of inrush current values. At decision block 612, the controller 104 determines whether the average of the third set of inrush current values is less than the maximum inrush current threshold. In response to determining that the average of the third set of inrush current values is less than the maximum inrush current threshold, process 600 proceeds to block 610 where controller 104 increases the flux match to a new flux match value and captures average transfer time and a new set of inrush current values. In response to determining that the average of the third set of inrush current values is greater than or equal to the maximum inrush current threshold, the process 600 proceeds to block 606, where controller 104 sets the flux match at the second flux match value and captures average transfer time and a new set of inrush current values.

While process 600 describes only three flux match values, in other examples, the process 600 may include any number of flux match values. For instance, in some variations, the process 600 may include five flux match values (e.g., the flux match values may be 5%, 10%, 15%, 20%, and 25%). In other variations, the process 600 may include eight flux match values (e.g., (e.g., the flux match values may be 5%, 10%, 12%, 15%, 20%, 25%, 27%, and 30%).

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. For example, the various embodiments of the kinematic, control, electrical, mounting, and user interface subsystems can be used interchangeably without departing from the scope of the invention. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A system for executing a transfer from a first power source to a second power source, the system comprising:
    the first power source and the second power source, wherein the first power source and the second power source are both electrically coupled to a transformer;
    the transformer electrically coupled to a load, wherein the first power source and the second power source are configured to provide power to the load via the transformer;
    one or more switching devices configured to switch between using the first power source to power the load or using the second power source to power the load;
    one or more sensors configured to detect an electrical measurement associated with powering the load; and
    a controller configured to:
        set a flux match to a first flux match value, wherein the flux match indicates a set range for switching between powering the load using the first power source and powering the load using the second power source;
        switch between powering the load using the first power source and powering the load using the second power source using the first flux match value and the one or more switching devices;
        obtain, from the one or more sensors, a first set of inrush current values associated with switching between powering the load using the first power source and powering the load using the second power source;
        adjust the flux match to a second flux match value based on the first set of inrush current values and a maximum inrush current threshold; and
        switch between powering the load using the first power source and powering the load using the second power source using the second flux match value and the one or more switching devices.

2. The system of claim 1, wherein the controller is further configured to:
    obtain, from the one or more sensors, a second set of inrush current values associated with switching between powering the load using the first power source and powering the load using the second power source;
    adjust the flux match from the second flux match value to a third flux match value based on the second set of inrush current values and the maximum inrush current threshold.

3. The system of claim 1, wherein the controller is further configured to:
    determine an average transfer time for switching between powering the load using the first power source and powering the load using the second power source;
    compare the average transfer time with a maximum transfer time threshold; and
    display a warning signal in response to determining that the determined average transfer time is greater than the maximum transfer time threshold.

4. The system of claim 1, wherein the first flux match value indicates the first set range for switching between powering the load using the first power source and powering the load using the second power source based on a phase of the first power source and a phase of the second power source.

5. The system of claim 4, wherein the controller is further configured to:
    switch, using the one or more switching devices, between powering the load using the first power source and powering the load using the second power source based on determining that a difference between a flux of the first power source and a flux of the second power source is within the first set range.

6. The system of claim 1, wherein the controller is configured to adjust the flux match to the second flux match value by:
    determining whether an average of the first set of inrush current values is greater than the maximum inrush current threshold, wherein the first set of inrush current values comprises two or more inrush current values; and
    decreasing the flux match from the first flux match value to the second flux match value in response to determining that the average of the first set inrush current values is greater than the maximum inrush current threshold.

7. The system of claim 6, wherein the controller is configured to adjust the flux match to the second flux match value by:
    increasing the flux match from the first flux match value to the second flux match value in response to determining that the average of the first set of inrush current values is less than the maximum inrush current threshold.

8. The system of claim 7, wherein the controller is further configured to compute the average of the first set of inrush current values by:
    detecting a plurality of times the system switches between powering the load using the first power source and powering the load using the second power source;
    obtaining, from the one or more sensors, an inrush current for each of the plurality of times; and
    calculating an average of the first set of inrush current values based on the obtained inrush current values for each of the plurality of times.

9. The system of claim 1, wherein the controller is configured to determine the maximum inrush current threshold by multiplying a rated load current associated with the transformer with a maximizing factor.

10. The system of claim 1, wherein the controller is further configured to:

determine whether the transformer is saturated based on switching between powering the load using the first power source and powering the load using the second power source using the different first flux match value.

11. The system of claim 10, wherein the controller is configured to determine whether the transformer is saturated by:
obtaining, from the one or more sensors, an inrush current and an applied voltage at the transformer when the system switches between powering the load using the first power source and powering the load using the second power source;
calculating a flux value at the transformer based on the obtained inrush current and the obtained applied voltage; and
determining whether the calculated flux value has exceeded a maximum flux rating of the transformer.

12. The system of claim 1, wherein both the first power source and the second power source comprise single phase or three phase power sources.

13. The system of claim 1, wherein the controller is further configured to:
obtain user input from a user indicating a manually provided flux match value; and
adjust the flux match to the manually provided flux match value.

14. A method for executing a transfer from a first power source to a second power source, the method comprising:
setting, by a controller, a flux match to a first flux match value, wherein the flux match indicates a set range for switching between powering a load using the first power source and powering the load using the second power source;
switching, by the controller, between powering the load using the first power source and powering the load using the second power source using the first flux match value and one or more switching devices;
obtaining, by the controller and from one or more sensors, a first set of inrush current values associated with switching between powering the load using the first power source and powering the load using the second power source;
adjusting, by the controller, the flux match to a second flux match value based on the first set of inrush current values and a maximum inrush current threshold; and
switching, by the controller, between powering the load using the first power source and powering the load using the second power source using the second flux match value and the one or more switching devices.

15. The method of claim 14, further comprising:
obtaining, by the controller and from the one or more sensors, a second set of inrush current values associated with switching between powering the load using the first power source and powering the load using the second power source;
adjusting, by the controller, the flux match from the second flux match value to a third flux match value based on the second set of inrush current values and the maximum inrush current threshold.

16. The method of claim 14, further comprising:
determining, by the controller, an average transfer time for switching between powering the load using the first power source and powering the load using the second power source;
comparing, by the controller, the average transfer time with a maximum transfer time threshold; and
displaying, by the controller, a warning signal in response to determining that the determined average transfer time is greater than the maximum transfer time threshold.

17. The method of claim 14, wherein the first flux match value indicates the first set range for switching between powering the load using the first power source and powering the load using the second power source based on a phase of the first power source and a phase of the second power source.

18. The method of claim 17, further comprising:
switching, using the one or more switching devices, between powering the load using the first power source and powering the load using the second power source based on determining that a difference between a flux of the first power source and a flux of the second power source is within the first set range.

19. The method of claim 14, further comprising:
determining, by the controller, whether an average of the first set of inrush current values is greater than the maximum inrush current threshold, wherein the first set of inrush current values comprises two or more inrush current values; and
decreasing, by the controller, the flux match from the first flux match value to the second flux match value in response to determining that the average of the first set inrush current values is greater than the maximum inrush current threshold.

20. A non-transitory computer-readable medium having processor-executable instructions stored thereon, wherein the processor-executable instructions, when executed by one or more processors, facilitate:
setting a flux match to a first flux match value, wherein the flux match indicates a set range for switching between powering a load using the first power source and powering the load using the second power source;
switching between powering the load using the first power source and powering the load using the second power source using the first flux match value;
obtaining a first set of inrush current values associated with switching between powering the load using the first power source and powering the load using the second power source;
adjusting the flux match to a second flux match value based on the first set of inrush current values and a maximum inrush current threshold; and
switching between powering the load using the first power source and powering the load using the second power source using the second flux match value.

* * * * *